United States Patent
Tanaka

(10) Patent No.: US 8,269,136 B2
(45) Date of Patent: Sep. 18, 2012

(54) LASER BEAM TREATMENT DEVICE AND SEMICONDUCTOR DEVICE

(75) Inventor: Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/840,338

(22) Filed: May 7, 2004

(65) Prior Publication Data

US 2005/0006655 A1    Jan. 13, 2005

Related U.S. Application Data

(63) Continuation of application No. PCT/JP02/11671, filed on Nov. 8, 2002.

(30) Foreign Application Priority Data

Nov. 9, 2001  (JP) .................................. 2001-345437

(51) Int. Cl.
*B23K 26/00* (2006.01)

(52) U.S. Cl. .......... 219/121.65; 219/121.66; 219/121.84

(58) Field of Classification Search ............. 219/121.65, 219/121.84, 121.83, 121.81, 121.82, 121.66; 356/432

See application file for complete search history.

(56) References Cited

U.S. PATENT DOCUMENTS

| | | | | |
|---|---|---|---|---|
| 4,211,488 A | * | 7/1980 | Kleinknecht | 356/369 |
| 4,415,794 A | * | 11/1983 | Delfino et al. | 219/121.85 |
| 4,790,664 A | * | 12/1988 | Saito et al. | 356/432 |
| 4,830,502 A | * | 5/1989 | Saito et al. | 356/432 |
| 5,422,714 A | * | 6/1995 | Fladd | 356/128 |
| 5,489,980 A | * | 2/1996 | Anthony | 356/308 |
| 6,059,873 A | * | 5/2000 | Yamaguchi et al. | 117/7 |
| 6,393,042 B1 | | 5/2002 | Tanaka | |
| 6,492,616 B1 | * | 12/2002 | Tanaka et al. | 219/121.71 |
| 6,700,096 B2 | * | 3/2004 | Yamazaki et al. | 219/121.73 |
| 6,744,008 B1 | * | 6/2004 | Kasahara et al. | 219/121.65 |
| 6,746,901 B2 | * | 6/2004 | Kasahara et al. | 438/149 |

(Continued)

FOREIGN PATENT DOCUMENTS

JP    59-99434    7/1984

(Continued)

OTHER PUBLICATIONS

International Preliminary Examination Report for PCT/JP02/11671 dated Jul. 22, 2004 (English Translation).

*Primary Examiner* — M. Alexandra Elve

(74) *Attorney, Agent, or Firm* — Nixon Peabody LLP; Jeffrey L. Costellia

(57) ABSTRACT

A laser beam treatment device capable of solving problem in a conventional technology that any uniform laser anneal cannot be realized since use of a galvano mirror changes the angle of incidence of the laser beam to the substrate and the reflected light from a back side of a transmissive substrate interferes with the reflected light from a surface of a semiconductor film or an interface between the semiconductor film and the substrate. Laser anneal is performed by using the laser beam treatment device comprising a laser, an optical system for shaping the laser beam oscillated from the laser, and a substrate holds to hold a work formed on the transmissive substrate, in which the substrate holder holds a liquid, and the liquid is brought into contact with the surface.

18 Claims, 14 Drawing Sheets

U.S. PATENT DOCUMENTS

| | | | |
|---|---|---|---|
| 6,750,423 B2 * | 6/2004 | Tanaka et al. | 219/121.73 |
| 6,844,523 B2 * | 1/2005 | Yamazaki et al. | 219/121.66 |
| 6,856,458 B2 * | 2/2005 | Greenwald et al. | 359/398 |
| 6,884,698 B1 * | 4/2005 | Ohtani et al. | 438/486 |
| 7,160,764 B2 * | 1/2007 | Tanaka | 438/166 |
| 2002/0146873 A1 | 10/2002 | Tanaka | |

FOREIGN PATENT DOCUMENTS

| | | | |
|---|---|---|---|
| JP | 06-333910 | | 12/1994 |
| JP | 11-145108 | * | 5/1999 |
| JP | 11-230860 | | 8/1999 |
| JP | 2000-234919 | | 8/2000 |
| JP | 2000-323428 | | 11/2000 |

* cited by examiner

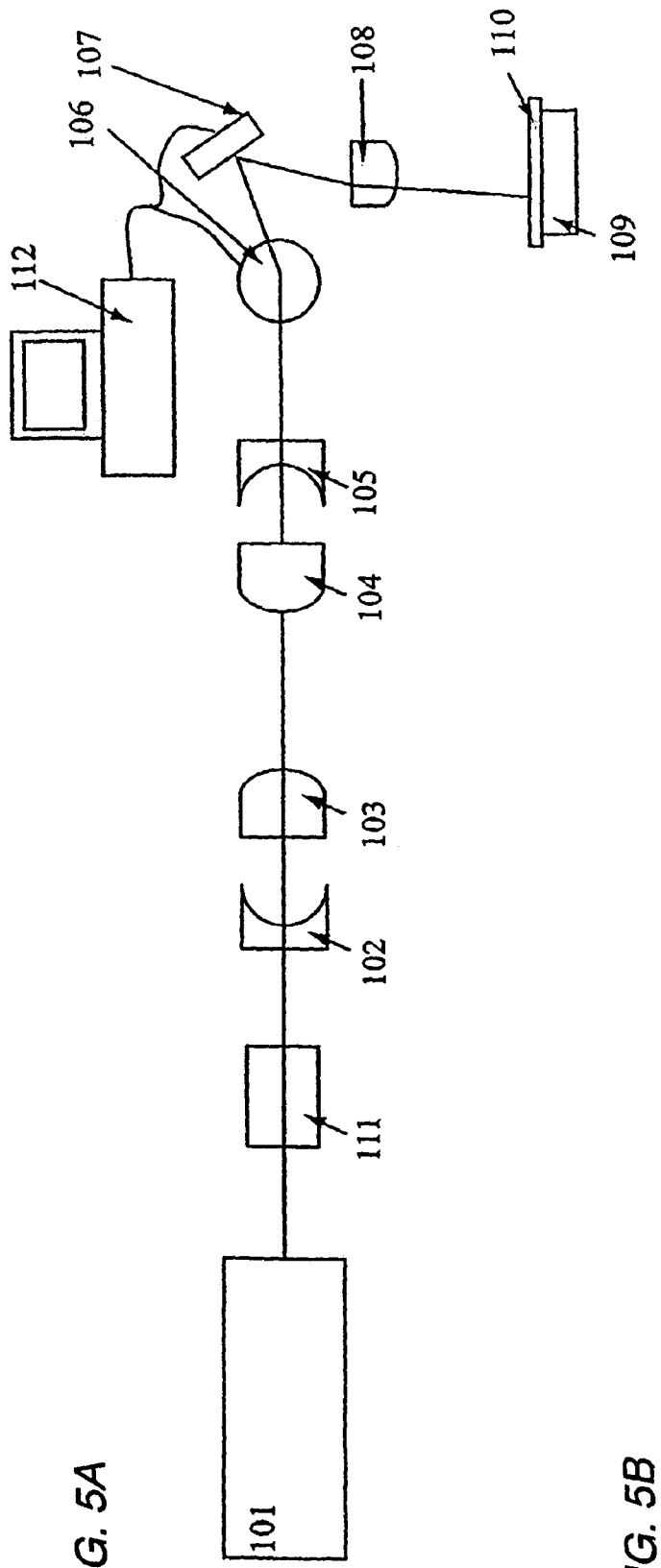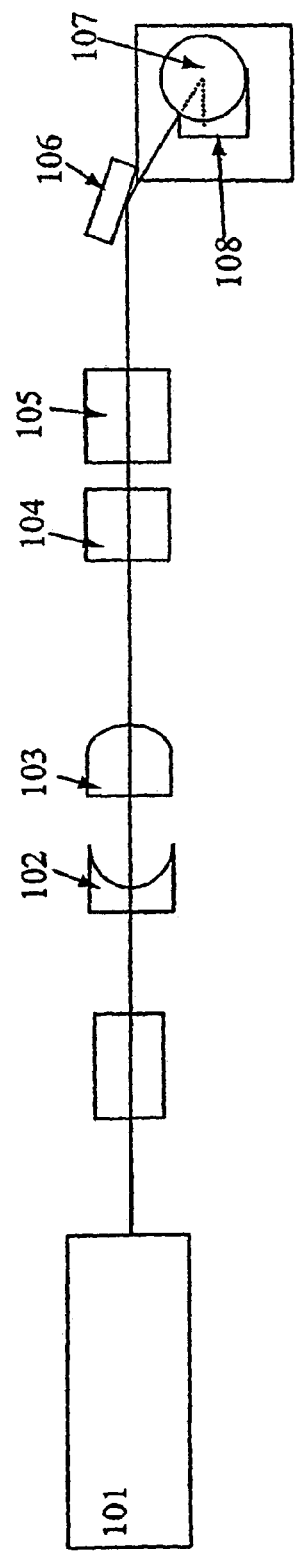
FIG. 5A
FIG. 5B

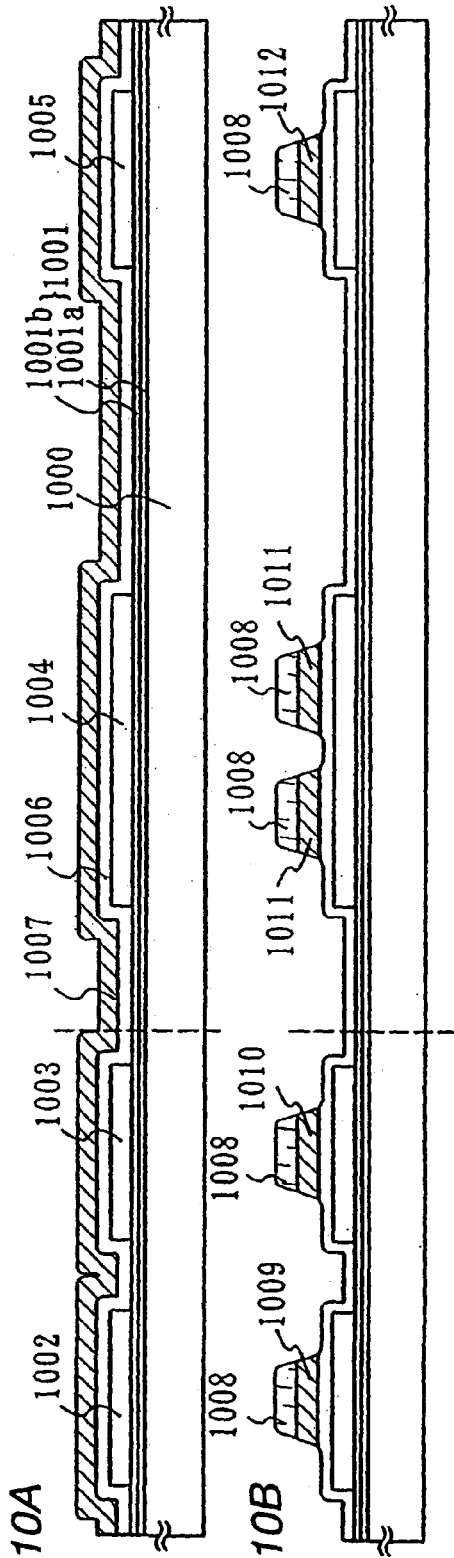
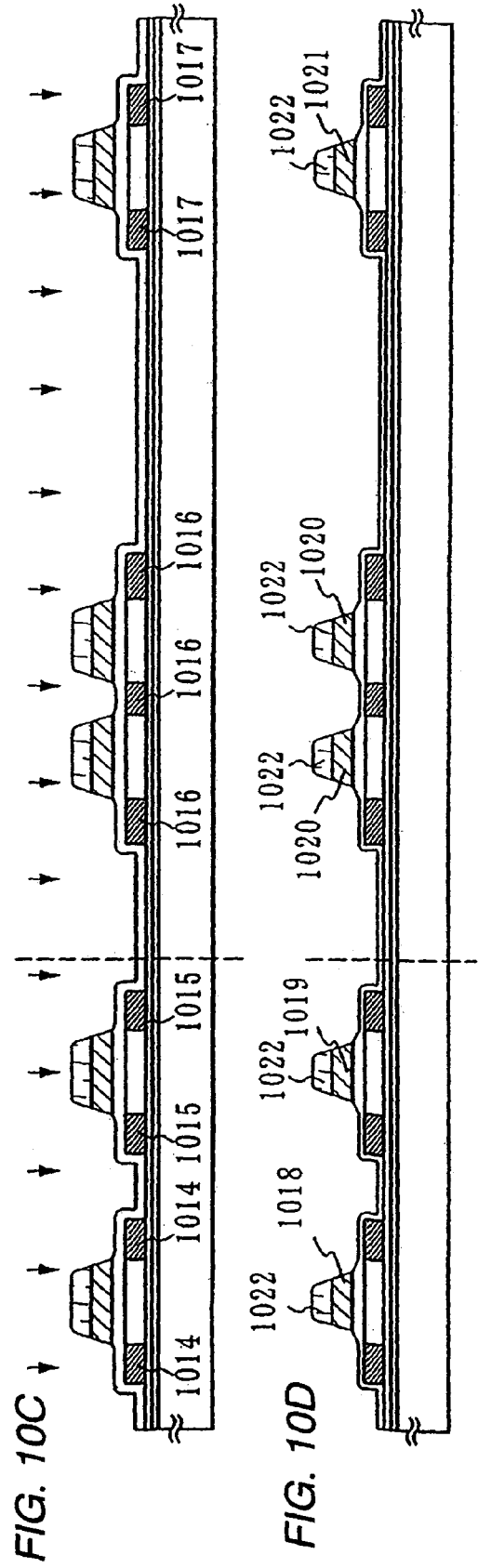
FIG. 10A
FIG. 10B
FIG. 10C
FIG. 10D

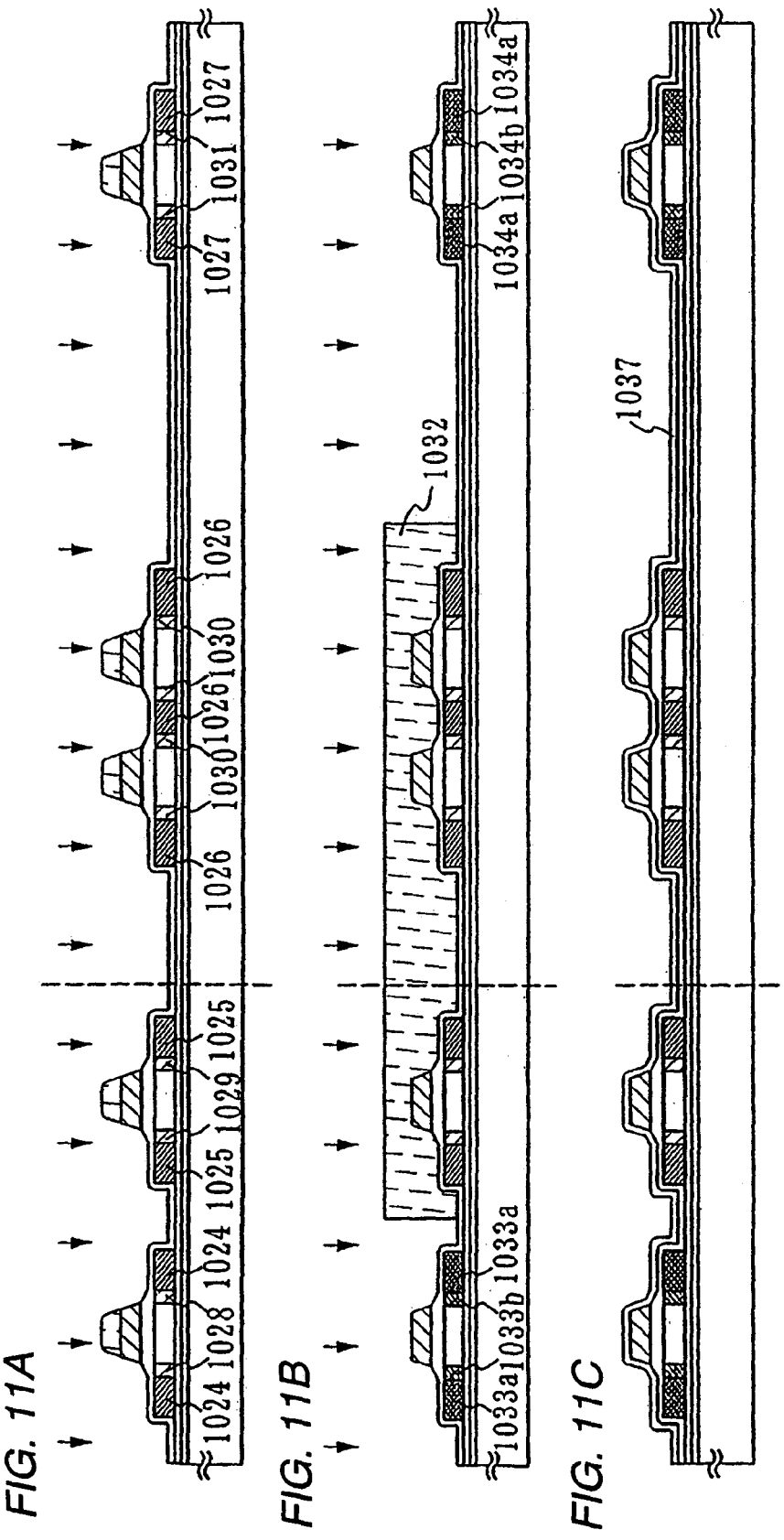

LASER BEAM TREATMENT DEVICE AND SEMICONDUCTOR DEVICE

TECHNICAL ART

The present invention relates to a laser beam treatment device (the device includes a laser and an optical system for guiding laser light outputted from the laser to a subject) for annealing a semiconductor film with laser light (hereinafter, laser annealing), and a semiconductor device manufactured by the laser beam treatment device.

BACKGROUND ART

In recent years, a thin film transistor (hereinafter, a TFT has been developed. The TFT which uses a polycrystalline silicon film (polysilicon film) as a crystalline semiconductor film has been attracted attention. Especially, in a liquid crystal display deice (liquid crystal display) or and EL (electro-luminescence) display device (EL display), the TFT is used as an element for switching pixels and for forming a driver circuit which controls the pixels.

A polycrystalline silicon film is used as an active layer for a thin film transistor. A source region, a drain region, and a channel formation region are formed by doping impurity elements belonging to 13th group or 15th group in the periodic table. An offset region or an LDD region may be provided.

As a means for obtaining a polycrystalline silicon film, a technique of forming a polycrystalline silicon film by crystallizing an amorphous silicon film is generally used. Especially, a method for crystallizing an amorphous silicon film using laser light is attracted attention in recent years. As used herein, the term "laser crystallization" refers to a means for obtaining a polycrystalline semiconductor film by crystallizing or recrystallizing a semiconductor film by laser light.

After doping impurity elements to a polycrystalline silicon film for forming a source region, a drain region, and an LDD region, the value of resistance is reduced by heating the polycrystalline silicon film. The process is referred to as activation. As used herein, the term "laser activation" refers to activation using laser light.

As used herein, the term "laser annealing" refers to laser light irradiation to these semiconductor films for heating.

By laser annealing, a semiconductor film can be heated instantly. Therefore, laser annealing is effective as a means of annealing a semiconductor film formed over a substrate having low heat resistance such as a glass substrate or a plastic substrate.

DISCLOSURE OF INVENTION

It is an object of the present invention to emit laser light uniformly to a semiconductor film formed over a substrate which is transparent to laser light.

In recent years, crystallization of a semiconductor film using a CW (continuous wave) laser is actively researched. CW laser light is processed in a circular shape or an elliptical shape and scan the semiconductor film to emit the CW laser light. Therefore, a semiconductor film having a crystal growth extended along the scanning direction can be formed. The semiconductor film is crystallized with laser light in an elliptical shape having the size of approximately 400×20 μm by scanning along a minor axis at several to several hundreds cm/s. Continuous oscillation type laser and pulse oscillation laser can be used in the present invention.

A $YVO_4$ laser, a YAG laser, a YLF laser, a glass laser, a $Y_2O_3$ laser, a $YAlO_3$ laser, or the like can be used for this process. $Nd^{3+}$, $Yb^{3+}$, $Cr^{4+}$, or the like can be used as dopant for the above-mentioned laser. The above-mentioned laser is preferably used by converting into second harmonics basically. In addition, higher harmonics than the second harmonics can be used. Alternatively, an excimer laser, a ruby laser, an alexandrite laser, a Ti: sapphire laser, an Ar laser, a Kr laser, a $CO_2$ laser, a helium-cadmium laser, a copper vapor laser, a gold vapor laser, or the like can be used. Plural of these lasers, or plural kinds of these lasers can also be used.

As a method for scanning using laser light in this process, a substrate placed on an XY stage may be transported, and a focus point may be moved by a galvanometer mirror or a polygon mirror.

Since the wavelength region of laser light used in this process passes through a part of a semiconductor film, the laser light reaches to the reverse side of a transmissive substrate. Therefore, reflective light from the reverse side of the transmissive substrate interferes with reflective light from the semiconductor film or from the interface between the semiconductor film and the substrate. Subsequently, laser annealing cannot be carried out uniformly. Further, since an incident angle of laser light to the substrate is changed in case of using a galvanometer mirror, cyclic repetition of the strong and weak of interference is occurred, laser annealing can not be carried out uniformly. The same is true in case of using an optical system using a polygon mirror, that is, interference is occurred.

As a result, the semiconductor film irradiated with laser light has the unevenness of irradiation which is referred to as interference fringes. FIG. 14 shows the semiconductor film having interference fringes formed by scanning the whole surface of an amorphous silicon film by laser light using a galvanometer mirror. The laser light is second harmonics from an Nd: $YVO_4$ laser. The semiconductor film having the size of 5×5 inches deposited over a transparent glass substrate having a thickness of t0.7 mm is used. Cyclic strong fringes in a horizontal direction are observed at the center portion of the semiconductor film. The fringes are caused by interference.

The interference of laser light is caused by reflective light from the interface between the reverse side of a substrate and the air. The purport of the present invention is to attenuate the reflective light.

Specifically, as shown in FIGS. 1A to 4B, laser annealing is carried out in the condition that the reverse side of a substrate 1 is in contact with liquid 2. The refractive indexes of the substrate and the liquid are preferably the same as each other. Liquid having a refractive index which is close to that of the substrate (the refractive index of a glass substrate to visible light is approximately 1.5) is preferably used. For example, a glass substrate having a refractive index of 1.5 and water having a refractive index of 1.33 are preferably used as the substrate and the liquid, respectively. In case that a substrate and liquid each of which has the same refractive index as each other are used, reflectance R at the reverse side of the substrate is attenuated to approximately on-tenth of that in the case that liquid is not used.

The reflectance of the substrate and the liquid is dependent on and determined by the wavelength λ of laser light. The reflectance R is given by the formula 1:

$$R = \{(N_0(\lambda) - N_1(\lambda))/(N_0(\lambda) + N_1(\lambda))\}^2$$

where $N_0(\lambda)$ is the refractive index of the substrate, and $N_1(\lambda)$ is the refractive index of the liquid as a function of the laser light (wavelength λ).

The reflectance is preferably at most 3%, $0 \leq R \leq 0.03$ in order for uniform laser irradiation with preventing interference. More preferably, the reflectance is preferably at most 0.5%, $0 \leq R \leq 0.005$. In order to obtain the reflectance R, a substrate having a refractive index $N_0(\lambda)$ and liquid having refractive index $N_1(\lambda)$ may be used.

Considering the fact that visible laser light is hardly attenuated in water it is necessary to prevent laser light in water from returning to the substrate. In case that the laser light is returned to the substrate, it is necessary to prevent the laser light in water from crossing reflective light from the semiconductor film and to attenuate the energy sufficiently.

FIGS. 1A and 1B show a substrate holder 3 full of water. The bottom surface of water is formed to have a curved surface to prevent laser light from returning to the original optical path. Further, it will be more effective to form the bottom surface rough so as to exhibit a diffuse reflection.

Anything can be provided below the water as long as it can prevent the interference of laser light over a semiconductor film. For example, a damper 4 for absorbing laser light or an undulating surface for diffusing laser light is preferably used. FIGS. 2A and 2B show dampers arranged in a linear manner. Mountains of scanning pitch and dampers are adjusted each other, and the mountains are arranged in a direction of scanning S, consequently, absorption properties can be improved.

FIGS. 3A and 3B show a bottom face cut into a quadrangular pyramid. Scattering surface is attached to the bottom surface to prevent reflected light from returning to a substrate.

FIGS. 4A and 4B show a bottom face composed of quadrangular pyramids. The quadrangular pyramids of the bottom surface prevents reflected light from returning to a substrate.

Accordingly, reflective light from the interface between the reverse surface of a substrate and the air can be prevented.

BRIEF DESCRIPTION OF DRAWINGS

FIGS. 5A and 5B show a laser beam treatment device and an object substrate according to the invention wherein 5A is a side view and 5B is a top view;

FIGS. 10A to 10D show processes for manufacturing a TFT included in an EL display device;

FIGS. 11A to 11C show processes for manufacturing a TFT included in an EL display device;

BEST MODE FOR CARRYING OUT THE INVENTION

Embodiment Mode 1

Figure 1A:
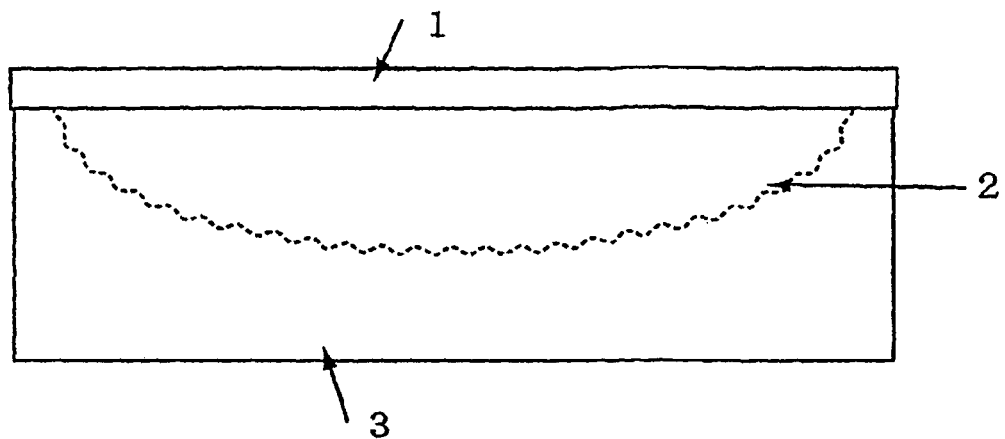
FIGS. 1A and 1B show a substrate and a substrate holder according to the invention wherein 1A is a side view and 1B is a top view.
Figure 1B:
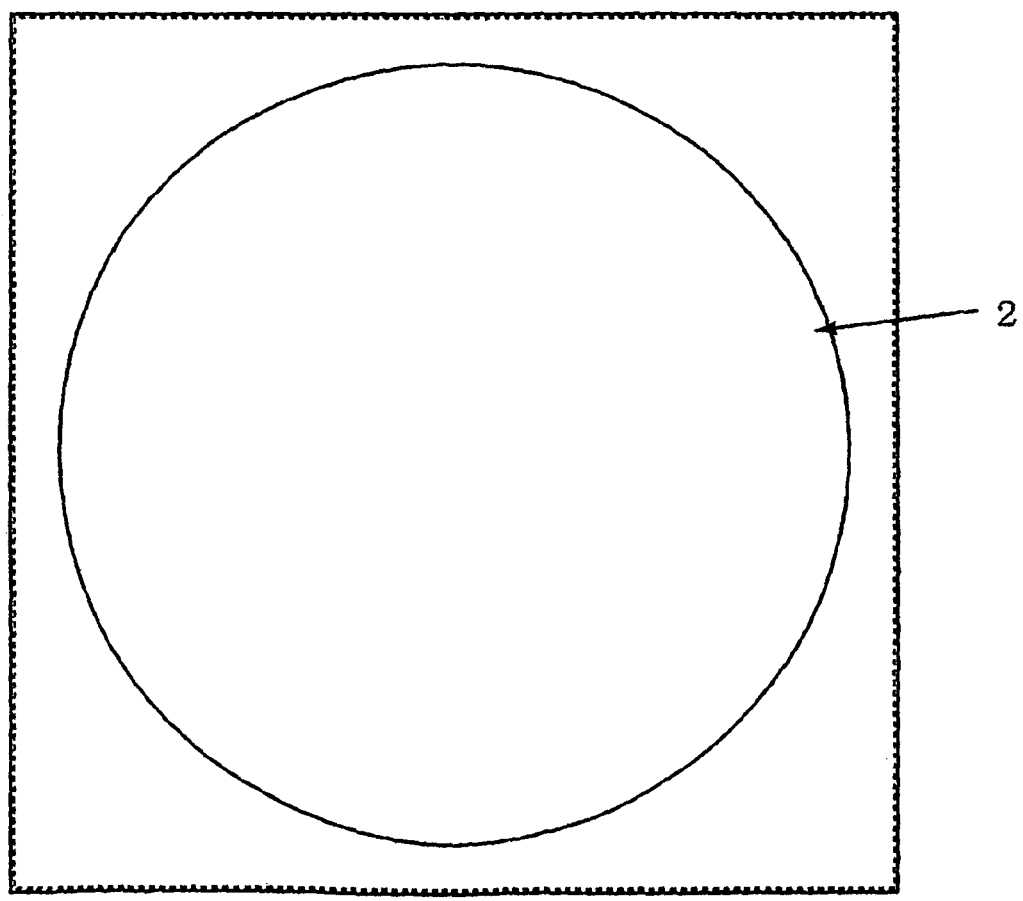

One embodiment mode of the present invention will be explained.

FIGS. 5A and 5B show the structure of a laser beam treatment device including a laser according to the invention. The laser beam treatment device comprises a continuous wave $Nd:YVO_4$ laser 101, an isolator 111, a concave spherical lens 102, a convex spherical lens 103, a concave cylindrical lens 104 for processing laser light (second harmonics, wavelength of 532 nm) emitted from the continuous wave $Nd:YVO_4$ laser 101, a convex cylindrical lens 105, galvanometer mirrors 106 and 107 for scanning using laser light, an f-θ lens 108 for adjusting a focal length on a substrate, a holder 109 for securing a substrate 110, and a computer 112.

The output power of a laser is 10 W. Laser light is shaped into a shape of an ellipse having a length of 20 μm along a minor axis and 400 μm along a major axis. The laser has a scanning rate of 50 cm/s. The melting of a semiconductor film depends on energy density per unit area. Therefore, the shape or the size of laser light can be changed as long as the energy density is almost same as before.

Figure 6:
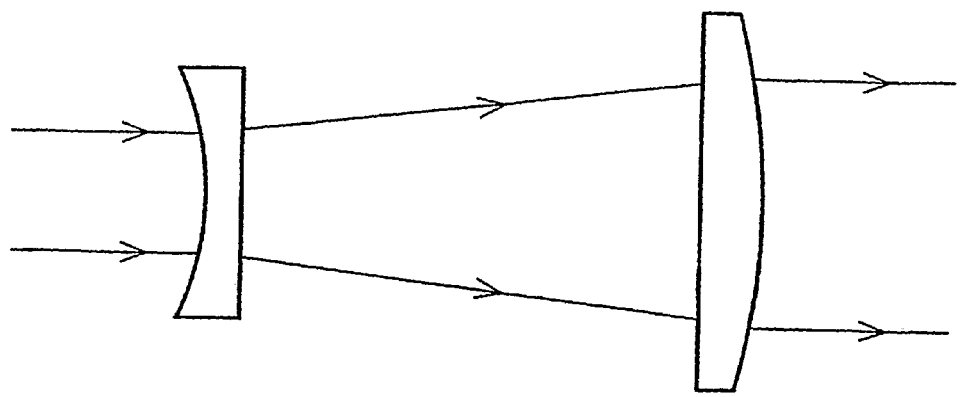
FIG. 6 shows a beam expander (Galileo type) in an optical system according to the invention.
Figure 7:
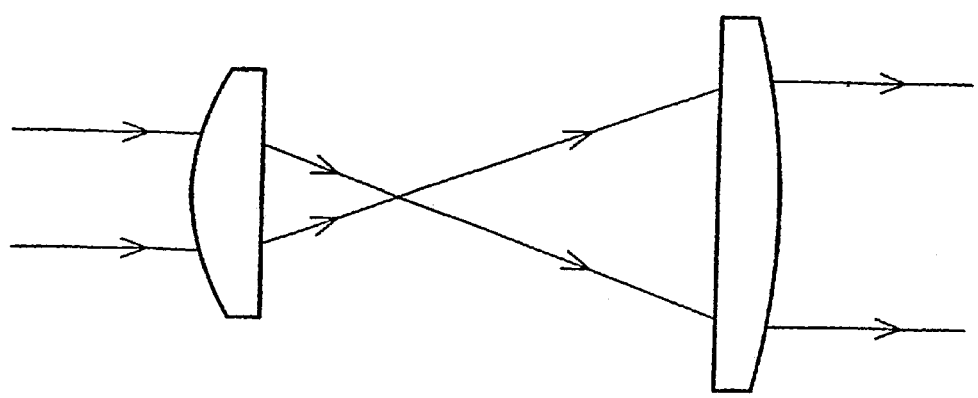
FIG. 7 shows a beam expander (Kepler type) in an optical system according to the invention.

As a method for expanding or contracting a laser beam by two lenses, Galileo type or Kepler type can be used. A Galileo type beam expander changes the size of a laser beam using a concave lens or a convex lens as shown in FIG. 6. Meanwhile, a Kepler type beam expander changes the size of a laser beam using two convex lenses as shown in FIG. 7. Either of them can be used, the Galileo type beam expander is used in this embodiment mode.

The spherical lens 102 (f=−50 mm) and the spherical lens 103 (f=200 mm) are disposed to have a distance of 150 mm from each other. The diameter of laser light emitted from the continuous wave $Nd:YVO_4$ laser 101 is quadrupled by these lenses, that is, the diameter of 2.5 mm is expanded to 10 mm.

In addition, the ratio of a major axis to a minor axis can be easily adjusted by expanding or contracting a laser beam only along a uniaxial direction with two cylindrical lenses. The convex cylindrical lens 104 (f=250 mm) and the concave cylindrical lens 105 (f=−100 mm) are disposed to have a distance of 150 mm from each other. A quadruple expanded laser beam is expanded only along a uniaxial direction by these lenses.

Further, two prisms can be used to expand or contract only along a uniaxial direction besides the cylindrical lens. Another apparatus can be used which is approximate equivalent to the above apparatus.

According to this embodiment mode, the divergence angle of a laser beam is controlled by expanding the diameter of a laser beam by a spherical lens. The divergence angle is reduced to a quarter by quadrupling the diameter of the laser beam since an $YVO_4$ laser has the divergence angle of 0.3 mrad. The beam diameter along a minor axis on a substrate is approximated by product of f of a last lens and divergence angle. The beam diameter is contract to 20 μm by applying the f-θ lens 108 (f=230 mm).

A cylindrical lens is used for shifting a focus along a major axis. The length of a laser beam along a major axis can be changed by changing the position of the lens or the focal point.

A laser beam is scanned by the galvanometer mirrors 106 and 107. A substrate is secured by a substrate holder full of water. Accordingly, crystallization can be carried out without moving the substrate.

Water is used in this embodiment mode, but any liquid can be used as long as the liquid has a refractive index which is close to that of glass. Given as examples of the liquid; acetylacetone, acetophenone, anisole, aniline, ethylbenzene, ethyldiamine, benzenecarbonyl chloride, glycerin, o-xylene, m-xylene, p-xylene, chlorobenzene, tetrachloroethylene, toluene, nicotine, silicon disulfide, (+)-α-pinene, pyridine, pyrrole, phenol, carbon tetrachloride, cyclohexanol, cyclohexanone, cyclohexene, 1,2-dichloroethane, dibromomethane, thiophene, cis-decalin, trans-decalin, bromobenzene, benzylamine, benzaldehyde, benzene, benzonitrile, formamide, mesitylene, 2-methylpyridine, methyl iodide, or iodine iodide.

Embodiment Mode 2

Embodiment Mode 1 according to the present invention explained crystallization, but Embodiment Mode 1 can be applied to laser annealing such as activation of a source and a drain regions. With respect to the kind of a laser, it is not limited to a CW (continuous wave) laser, but a pulse Nd:YAG laser which has long coherent length can be used since it has problems similarly to the CW laser. A linear laser annealing using a pulse Nd:YAG laser will be explained in Embodiment Mode 2.

Figure 8A:
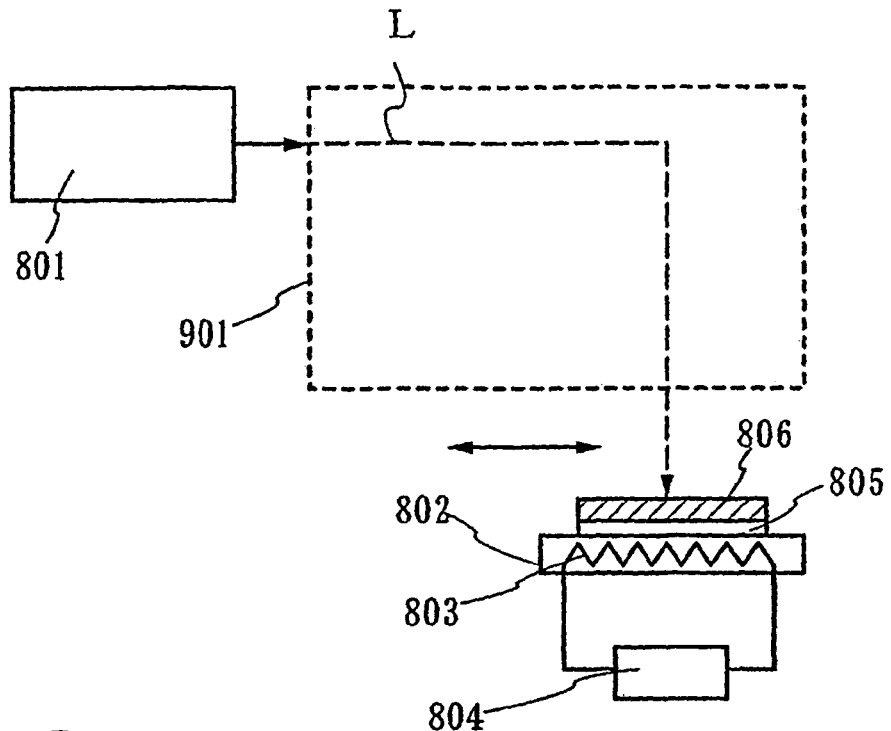
FIGS. 8A and 8B show a laser beam treatment device and a subject substrate according to the invention wherein 8A is a side view and 8B is a top view.

FIG. 8A shows a structure of a laser beam treatment device including a laser according to the invention. The laser beam treatment device comprises an Nd:YAG laser 801, an optical system 901 for processing laser light L (preferably, second harmonics, third harmonics, or fourth harmonics) emitted from an oscillation source of the Nd:YAG laser, and a substrate holder 802 for securing a transmissive substrate.

In addition, in the case that laser light emitted from the Nd:YAG laser 801 is converted to any one of second to fourth harmonics, a wavelength modulator including a nonlinear element may be disposed at close behind the Nd:YAG laser 801.

Figure 8B:
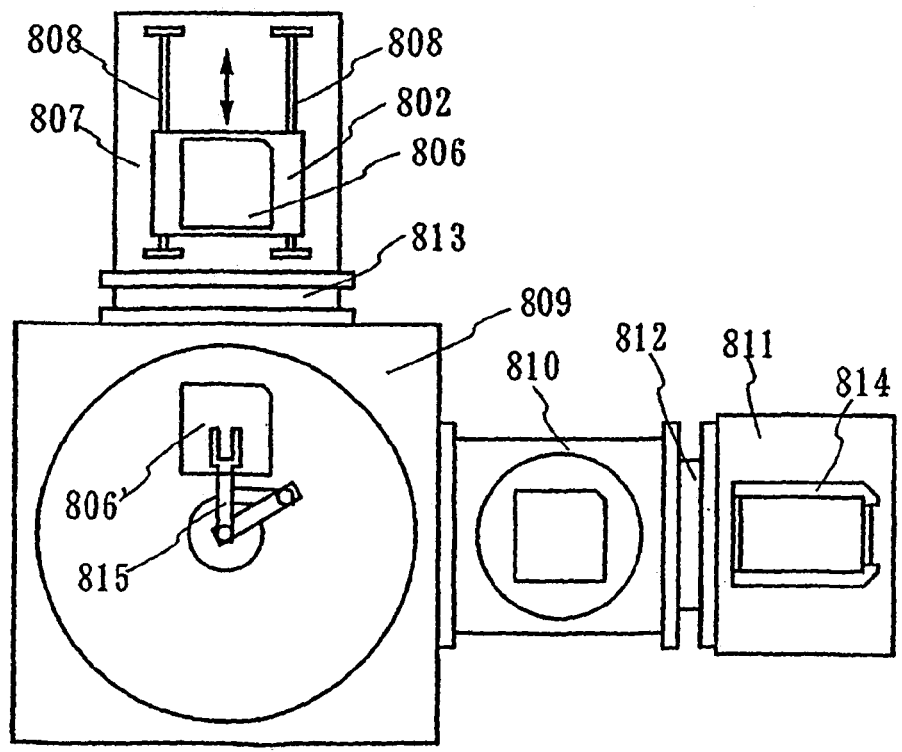

The substrate holder 802 can move in an irradiation chamber 807 along a guide rail 808 to emit laser light to overall of a substrate. Laser light is incident from a window formed by quartz (not shown) provided over a top surface of the substrate 806. As shown in FIG. 8B, a transfer chamber 809, an intermediate chamber 810, and a load/unload chamber 811 are coupled with the irradiation chamber 807 via gate valves 812, 813, respectively.

The load/unload chamber 811 is provided with a cassette 814 which can hold a plurality of substrates. A transportation robot 815 provided to the transfer chamber 809 transports the substrate. A substrate 806 denotes the substrate which is being transported. Accordingly, laser annealing treatment can be carried out at a reduced pressure or in an inert gas atmosphere.

Figure 9A:
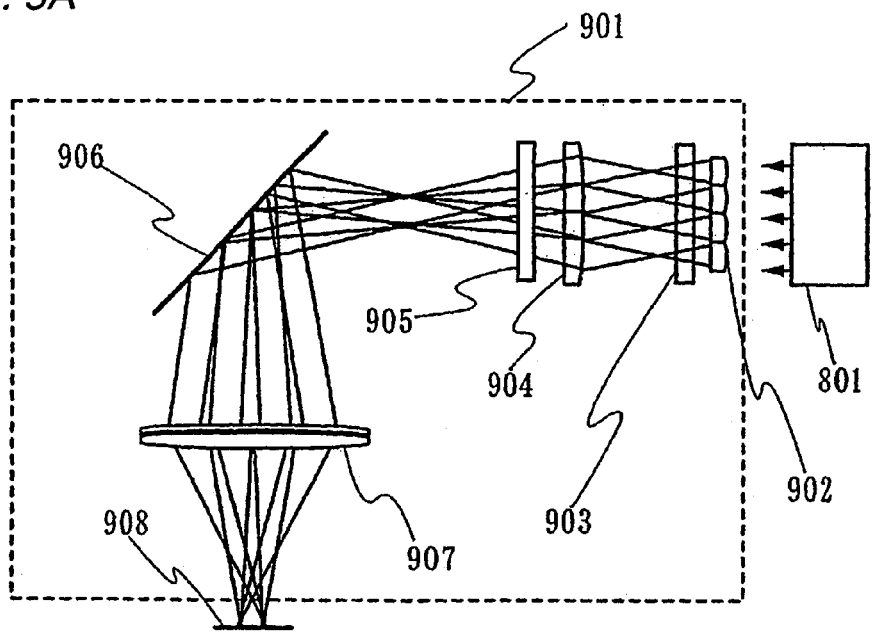
FIGS. 9A and 9B show a laser beam treatment device and a subject substrate according to the invention wherein 9A is a side view and 9B is a top view.
Figure 9B:
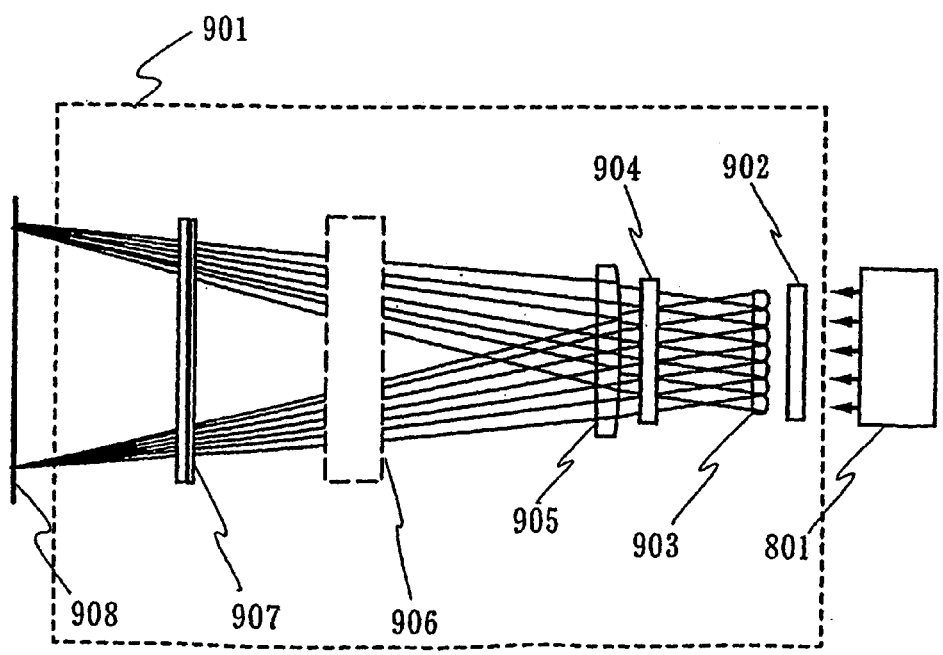

A structure of the optical system 901 for processing laser light into a linear shape will be explained with reference to FIGS. 9A and 9B. FIG. 9A is a side view of the optical system 901. FIG. 9B is a top view of the optical system 901.

The laser light emitted form an oscillation source of the laser 801 is divided along lengthwise direction by a cylindrical lens array 902. The divided laser light is further divided along crosswise direction by a cylindrical lens 903. Therefore, laser light is finally divided into a matrix shape by the cylindrical lens arrays 902, 903.

Then, laser light is once condensed by a cylindrical lens 904. And then, the laser light passes through the cylindrical lens 905 after passing through the cylindrical lens 904. Thereafter, the laser light is reflected by a mirror 905, and pass through a cylindrical lens 907, then, achieves to an irradiation surface 908.

At this time, the laser light projected on the irradiation surface 908 shows a linear shape. That is, the cross-sectional shape of the laser light which passes through the cylindrical lens 907 is in a linear shape. The width direction of the linear shaped laser light is homogenized (shorter direction) by the cylindrical lens array 902, the cylindrical lens 904, and the cylindrical lens 907. Further, the length direction (longer direction) of the laser light is homogenized by the cylindrical lens array 903 and the cylindrical lens 905. In this instance, in case that a light source such as an Nd:YAG laser has high coherent properties, it is necessary to give an optical path difference bigger than a coherent length to each the above described light divided into a matrix shape.

According to this embodiment mode, laser light emitted from an oscillation source of a solid laser can be processed into a linear shape, and the laser light can be emitted to overall of a transmissive substrate deposited with an amorphous silicon film.

EMBODIMENT 1

Embodiments according to the present invention will be explained with reference to FIGS. 10A to 12B. In this embodiment, a method for manufacturing simultaneously a switching thin film transistor and a drive thin film transistor, each of which composes a pixel circuit over a substrate, and a thin film transistor which composes an inverter circuit of a periphery drive circuit will be explained in detail in accordance with the process. In addition, an erasing thin film transistor can be manufactured similarly to the switching thin film transistor, and will not be further explained. FIG. 13 shows a pixel portion of an EL display device according to the invention. As shown in FIG. 13, pixel electrodes (1310 and 1320), erasing TFTs (1311 and 1321), connecting wiring (1312 and 1322), active layers used for capacity (1313 and 1323), condensers (1314 and 1324), a first sub-pixel (1315), a second sub-pixel (1325), drive TFTs (1316 and 1326), gate wirings (1317 and 1327), connection wirings (1318 and 1328), and switching TFTs (1319 and 1329) are provided to the pixel portion.

In FIG. 10A, glass such as barium borosilicate glass or aluminoborosilicate glass as represented by the glass #7059 or the glass #1737 of Corning Co. can be used as a substrate 1000. Besides, a plastic substrate such as a quartz substrate, polyethylene terephthalate (PET), polyethylene naphthalate (PEN), or polyether sulfone (PES) can be used.

In order to prevent impurities from diffusing from the substrate 1000, a base film 1001 is formed by an insulating film such as silicon oxide film, silicon nitride film, or silicon oxynitride film over the surface of the substrate 1000 provided with TFTs. In this embodiment, a base film 1001 has a two-layer structure, but the base film may be formed by a single layer of the insulating film or two or more laminated layers of the insulating films. The first layer of the base film 1001 is formed by a silicon oxynitride film 1001a which is formed to have a thickness of from 10 to 200 nm (preferably, from 50 to 100 nm) by plasma CVD using $SiH_4$, $NH_3$ and $N_2O$ as a reaction gas. In this embodiment, the silicon oxynitride film 1001a (having a composition ratio of Si=32%, O=27%, N=24%, H=17%) is formed to have a thickness of 50 nm. The second layer of the base film 1001 is formed by a silicon oxynitride film 1001b which is formed to have a thickness of from 50 to 200 nm (preferably, from 100 to 150 nm) by plasma CVD using $SiH_4$ and $N_2O$ as a reaction gas. In this embodiment, the silicon oxynitride film 1001b (having a composition ratio of Si=32%, O=59%, N=7%, H=2%) is formed to have a thickness of 100 nm.

An amorphous semiconductor film 1003 is formed to have a thickness of from 25 to 150 nm (preferably, 30 to 60 nm) by a known means such as plasma CVD, LPCVD or sputtering. Though there is no limitation on the material of the semiconductor film, silicon or a silicon-germanium ($Si_xGe_{1-x}$ (X=0.0001 to 0.02)) alloy is preferably used. In this embodiment, an amorphous silicon film is formed to have a thickness of 55 nm by plasma CVD.

Then, the amorphous semiconductor film is treated in ozone water, and then, a silicon oxide film is formed over the semiconductor film. Thereafter, nickel acid solution of 5 ppm is coated over the silicon oxide film.

The semiconductor film is crystallized by heat treatment at 550° C. for four hours.

Figure 2A:
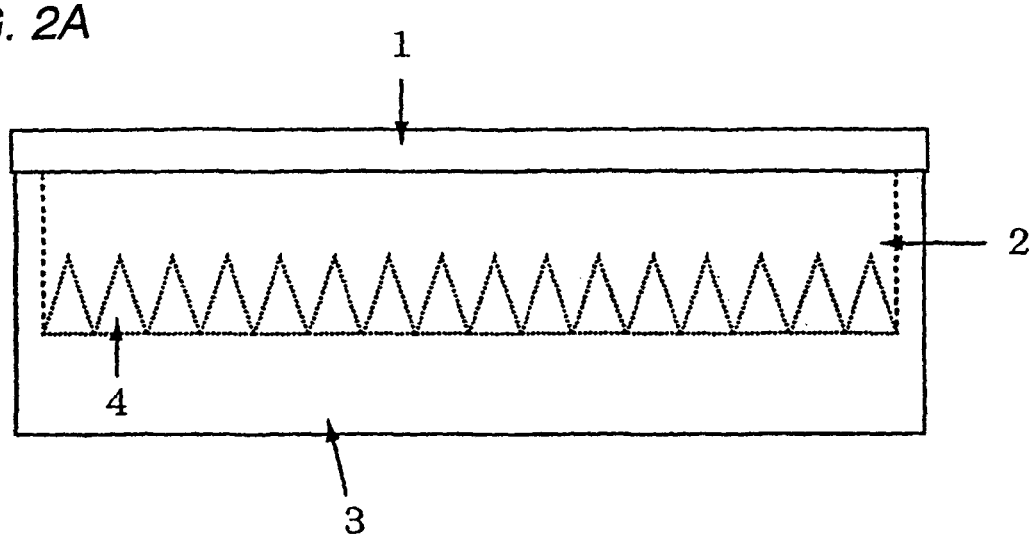
FIGS. 2A and 2B show a substrate and a substrate holder according to the invention wherein 2A is a side view and 2B is a top view.
Figure 2B:
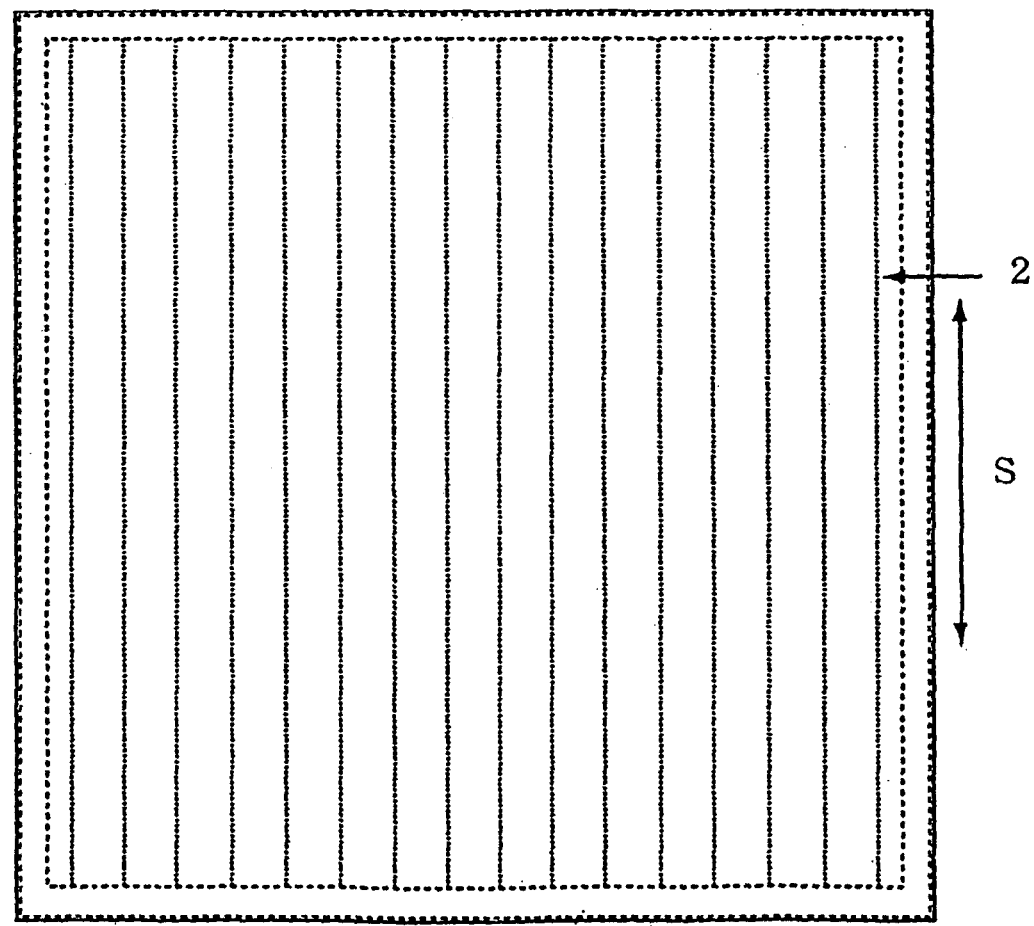
Figure 3A:
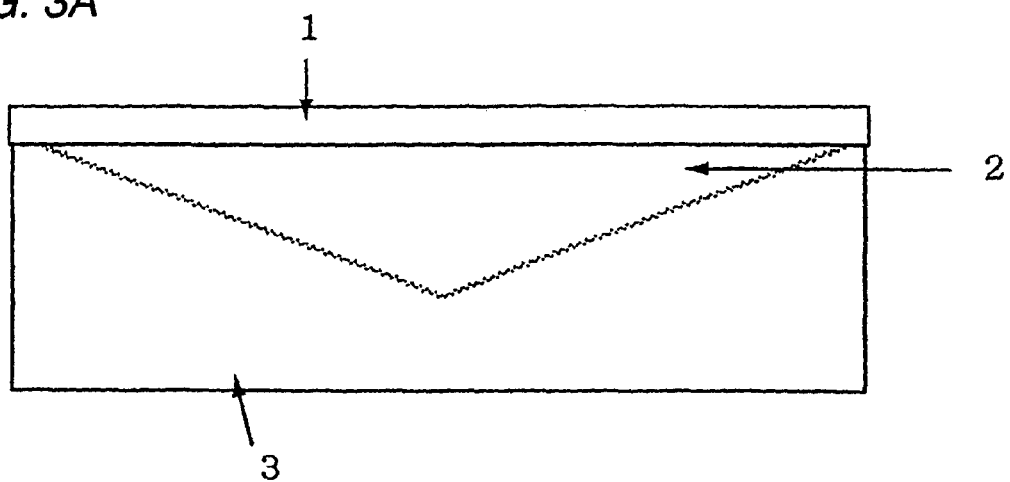
FIGS. 3A and 3B show a substrate and a substrate holder according to the invention wherein 3A is a side view and 3B is a top view.
Figure 3B:
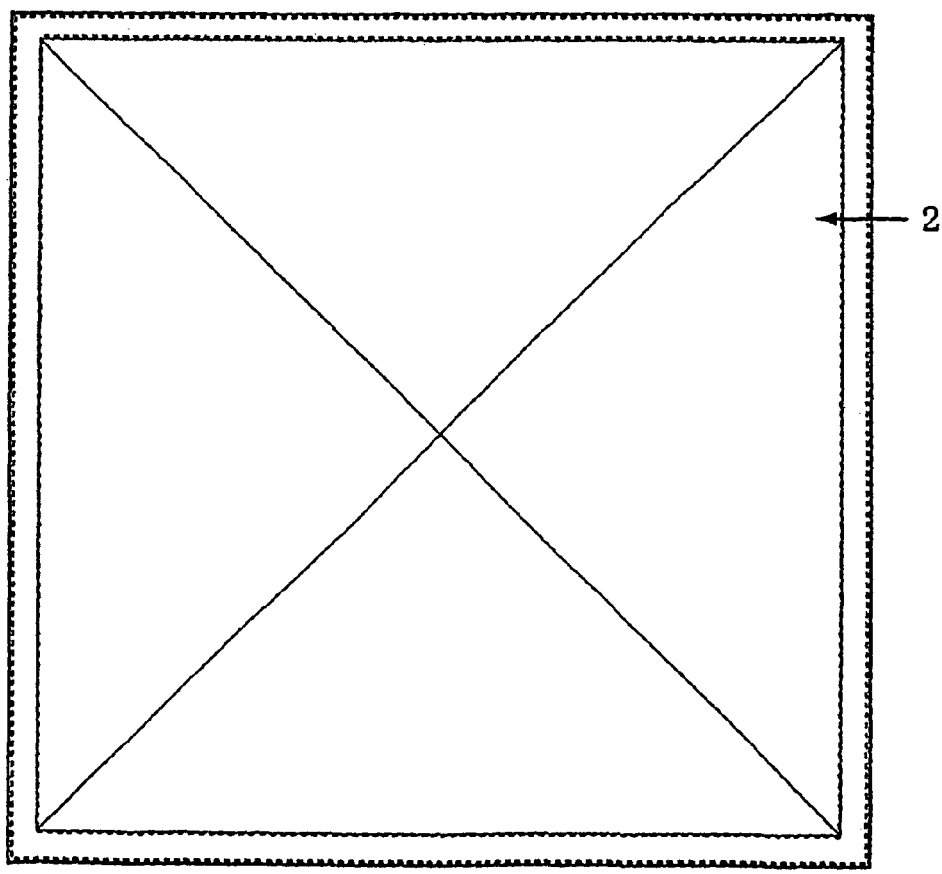
Figure 4A:
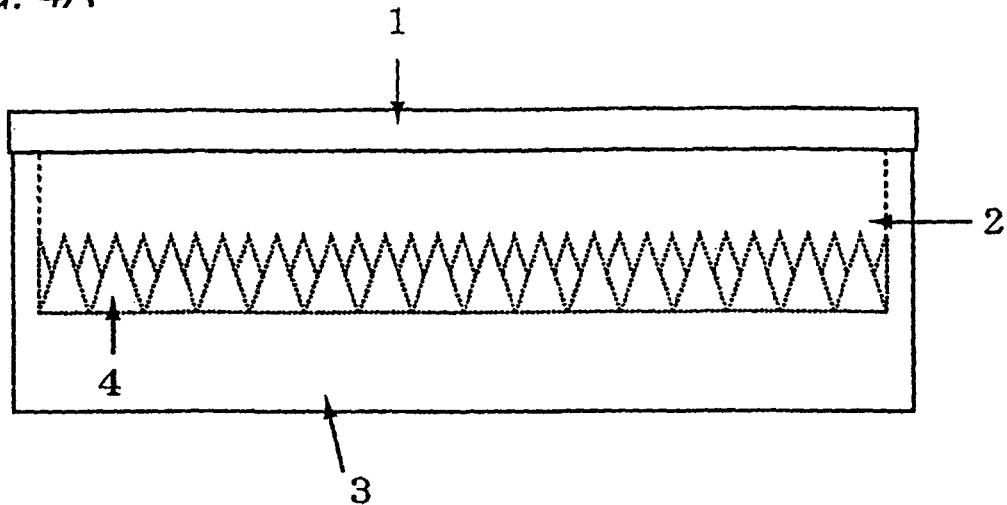
FIGS. 4A and 4B show a substrate and a substrate holder according to the invention wherein 4A is a side view and 4B is a top view.
Figure 4B:
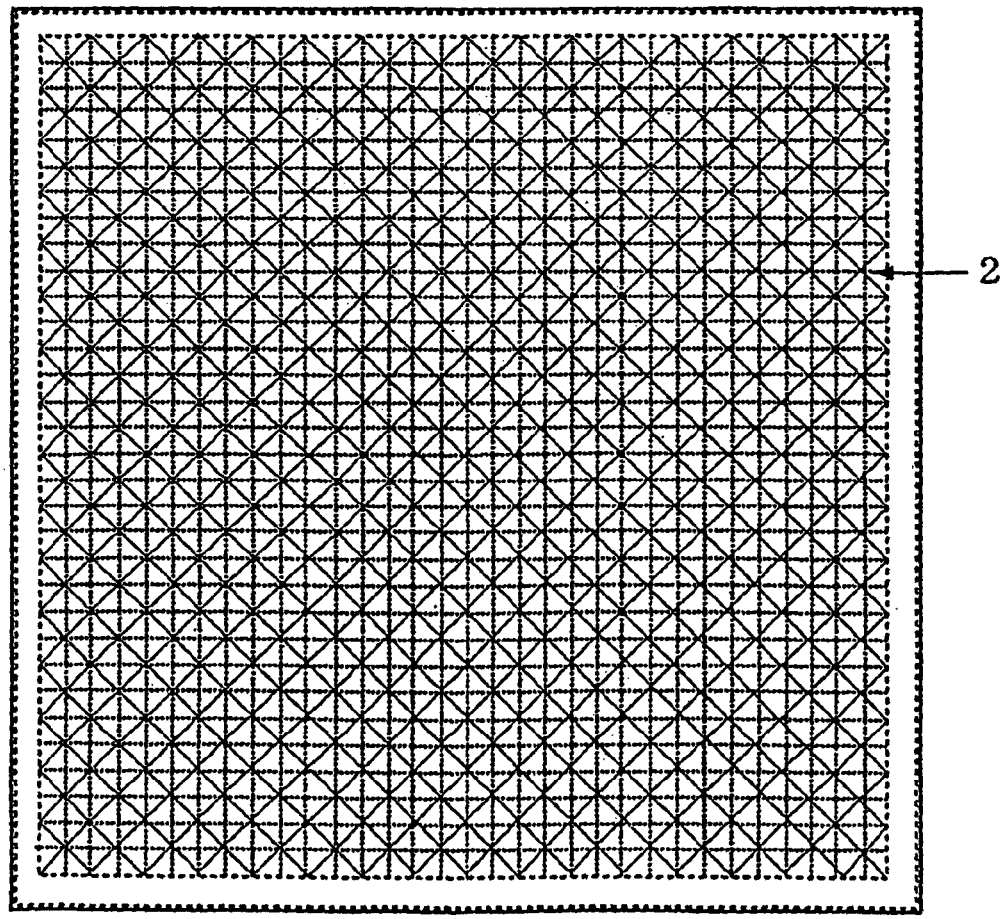

Here, a substrate provided with a crystalline semiconductor film is set to the optical system shown in FIGS. 5A and 5B to recrystallize the crystalline semiconductor film by CW laser light irradiation. The substrate is secured by the substrate holder filled with water shown in FIGS. 2A and 2B. The beam damper of the substrate holder shown in FIGS. 2A and 2B is adjusted to a scanning pitch. The CW laser has output power of 8 W, beam diameter of 400 μm×20 μm, and scanning rate of 50 cm/s.

Laser light scan the substrate in one direction. Accordingly, the crystal growth direction of the semiconductor film coincides with the scanning direction of the laser. In accordance with the fact that electrical characteristics are improved when the crystal growth direction coincides with the current flow directions of the formed TFTs, laser light scan the substrate so as to coincide with the current flow directions of transistors composing a pixel circuit. The current flow directions of the transistors are the same with each other as shown in FIG. 13.

The crystalline semiconductor film is patterned by photolithography to form semiconductor layers 1002 to 1005.

After forming the semiconductor layers 1002 to 1005, a minute amount of impurity elements (boron or phosphorus) may be doped into the semiconductor layers 1002 to 1005.

Next, a gate insulating film 1006 is formed to cover the semiconductor layers 1002 to 1005. The gate insulating film 1006 is formed by an insulating film containing silicon to have a thickness of from 40 to 150 nm by plasma CVD or sputtering. In this embodiment, a silicon nitride oxide film (composition ratio Si=32%, O=59%, N=7%, H=2%) is formed to have a thickness of 110 nm by plasma CVD. Needless to say, the gate insulating film is not limited to the silicon nitride oxide film, and another single layer or laminated layer of insulating films containing silicon can be adopted as well.

Moreover, in the case that a silicon oxide film is used, the film may be formed by mixing TEOS (tetraethyl orthosilicate) into $O_2$ by plasma CVD in the condition, that is, a reaction pressure of 40 Pa; a substrate temperature of from 300 to 400° C.; and electric discharge at a high frequency (13.56 MHz) power density of from 0.5 to 0.8 $W/cm^2$. Thus formed silicon oxide film can obtain good characteristics as a gate insulating film by the subsequent thermal annealing at from 400 to 500° C.

Then, a heat resistant conductive layer 1007 for forming a gate electrode is formed over the gate insulating film 1006 to have a thickness of from 200 to 400 nm (preferably, from 250 to 350 nm). The heat resistant conductive layer 1007 can be formed by a single layer or a lamination layer of a plurality of layers such as two layers or three layers if necessary. The heat resistant conductive layer includes an element selected from the group consisting of Ta, Ti, and W; alloys containing these elements as its components; or an alloy film formed by combining these elements. The heat resistant conductive layer is formed by sputtering or CVD. In order to reduce the resistance, it is preferable to reduce the concentration of impurities contained in the heat resistant conductive layer. In particular, an oxygen concentration is preferably reduced to at most 30 ppm. In this embodiment, a W film may be formed by sputtering with a W target, or thermal CVD with tungsten hexafluoride ($WF_6$). In any case, resistance should be reduced to serve the heat resistant film as a gate electrode. The resistivity of the W film is preferably at most 20 μΩcm. The resistivity of the W film can be reduced by enlarging the crystal grains, however the resistivity is increased since the crystallization is prohibited in the case that a large amount of impurity elements such as oxygen is contained in the W film. Thereby, the resistivity can be set from 9 to 20 μΩcm by using a W target of 99.99% or 99.9999% purity with sufficient attention for preventing impurities from a gas phase during the film formation in case of using sputtering.

On the other hand, in the case that a Ta film is used for the heat resistant conductive layer 1007, the Ta film can be also formed by sputtering. The Ta film is formed by sputtering with an Ar gas. Further, if an appropriate amount of Xe or Kr is added to the gas for sputtering, the internal stress of the film is relaxed so that the film is prevented from peeling. The Ta film of α phase can be used as the gate electrode since the resistivity is approximately 20 μΩcm, but the Ta film of β phase is unsuitable for the gate electrode since the resistivity is approximately 180 μΩcm. Since a TaN film has a crystal structure which is similar to that of the α phase, the Ta film of the α phase can be obtained easily by forming the TaN film as a base for the Ta film. Moreover, though not shown, it is effective to form a silicon film doped with phosphorus (P) to have a thickness of from 2 to 20 nm below the heat resistant conductive layer 1007. Thereby, adhesion of the film which is formed over the heat resistant conductive layer 1007 can be improved and oxidization of the film can be prevented, simultaneously, a minute amount of alkaline elements contained in the heat resistant conductive layer 1007 can be prevented from diffusing to a first shape gate insulating film 1006. In either case, the heat resistant conductive layer 1007 is preferably formed to have the resistivity of within the range of from 10 to 50 μΩcm.

Next, a mask 1008 is formed by resist by a photolithography technique. Then, a first etching treatment is carried out. In this embodiment, the first etching treatment is carried out by an ICP etching device in the condition, that is, an etching gas of $Cl_2$ and $CF_4$; a RF (13.56 MHz) power of 3.2 $W/cm^2$; and a pressure of 1 Pa. A RF (13.56 MHz) power of 224 $mW/cm^2$ is applied to the substrate side (sample stage) so that a negative self bias voltage is substantially applied thereto. The etching rate of the W film is approximately 100 nm/min in this condition. The first etching treatment takes time which is 20% longer than that which is estimated for etching the W film based on the etching rate of the W film.

Conductive layers 1009 to 1012 having first tapered shapes are formed by the first etching treatment. The conductive layers 1009 to 1012 are formed to have tapered angles of from 15 to 30°. In order to etch without a residue, over-etching treatment which requires approximately from 10 to 20% increased etching time is carried out. Since the selection ratio of the silicon nitride oxide film (gate insulating film 1006) to the W film is from 2 to 4 (typically, 3), the exposed silicon nitride oxide film is etched away approximately from 20 to 50 nm by the over-etching treatment (FIG. 10B).

Then, a first doping is carried out to dope impurity elements imparting one conductive type to the semiconductor layer. Here, impurity elements impart n-type. The mask 1008 forming the first shape conductive layer is left as it is, and impurity elements imparting p-type in a self aligning manner are doped using the conductive layers 1009 to 1012 having first tapered shapes as masks by ion doping method. In order to dope the impurity elements imparting n-type to the semiconductor layer through the tapered edge portion of the gate electrode and the gate insulating film 1006, the impurity elements are doped in the condition, that is, dosage of from $1 \times 10^{13}$ to $5 \times 10^{14}$ atoms/cm$^2$, and an acceleration voltage of from 80 to 160 keV. As the impurity elements imparting n-type, elements belonging to the 15th group in a periodic table, typically phosphorus (P) or arsenic (As) can be used. Here, phosphorus is used. Accordingly, first impurity regions 1014 to 1017 are doped with impurity elements imparting n-type by the ion doping method in the concentration range of from $1 \times 10^{20}$ to $1 \times 10^{21}$ atomic/cm$^3$. (FIG. 10C)

In this step, the impurities may be moved below the first shape conductive layers 1009 to 1012, and the first impurity regions 1014 to 1017 may be overlapped with the first shape conductive layers 1009 to 1012 depending on the doping condition.

Next, as shown in FIG. 10D, second etching treatment is carried out. Similarly, the etching treatment is carried out with the ICP etching device using a mixture gas of CF$_4$ and Cl$_2$ as an etching gas in the condition, that is, a RF power of 3.2 W/cm$^2$ (13.56 MHz), a bias power of 45 mW/cm$^2$ (13.56 MHz), and a pressure of 1.0 Pa. Thereby, conductive layers 1018 to 1021 having the second shape are formed. Tapered portions are formed at the edge portion of the conductive layers 1018 to 1021. The thickness of the tapered portion is increased from the outward portion toward the inward portion. Extra isotropic etching is carried out since bias power applied to the substrate side is reduced compared with the case of the first etching treatment. Consequently, the angle of the tapered portion becomes from 30 to 60°. The edge portion of the mask 1008 is etched away to form a mask 1022. Moreover, in the process shown in FIG. 10D, the surface of the gate insulating film 1006 is etched away approximately 40 nm.

Then, impurity elements imparting n-type are doped in the condition, that is, smaller amount of dosage than that of the first doping treatment, and a high acceleration voltage. For example, $1 \times 10^{13}$/cm$^2$ dosage of the impurities is doped at an acceleration voltage of from 70 to 120 KeV. Thus obtained first impurity regions 1024 to 1027 having a high impurity concentration and the second impurity regions 1028 to 1031 which are in contact with the first impurity regions 1024 to 1027 are formed. In this step, the impurities may be moved below the second shape conductive layers 1018 to 1021, and the second impurity regions 1028 to 1031 may be overlapped with the second shape conductive layers 1018 to 1021 depending on the doping condition. The impurity concentration in the second impurity region is set to be $1 \times 10^{16}$ to $1 \times 10^{18}$ atoms/cm$^3$. (FIG. 11A)

Then, as shown in FIG. 11B, impurity regions 1033 (1033a and 1033b) and 1034 (1034a and 1034b) having a conductive type which is opposite to a certain conductive type are formed in the semiconductor layers 1002 and 1005 for forming a p-channel type TFT. Also in this instance, impurity elements imparting p-type are added using the second shape conductive layers 1018 and 1021 as masks to form an impurity region in a self aligning manner. Here, the whole surface of the semiconductor layers 1003 and 1004 serving as n-channel type TFTs are overlapped by a resist mask 1032. The impurity regions 1033 and 1034 are formed by diborane (B$_2$H$_6$) by an ion doping method. The concentration of the impurity elements imparting p-type in the impurity regions 1033 and 1034 is set to be $2 \times 10^{20}$ to $2 \times 10^{21}$ atoms/cm$^3$.

However, each the impurity regions 1033 and 1034 may be divided into two areas, each of which contains impurity elements imparting n-type. The third impurity regions 1033a and 1034a contain impurity elements imparting n-type in a concentration of from $1 \times 10^{20}$ to $1 \times 10^{21}$ atoms/cm$^3$, and the fourth impurity regions 1033b and 1034b contain impurity elements imparting n-type in a concentration of from $1 \times 10^{17}$ to $1 \times 10^{20}$ atoms/cm$^3$. There will be no problem when the third impurity region serves as the source region and the drain region of a p-channel type TFT by setting the concentration of impurity elements imparting p-type in the impurity regions 1033b and 1034b as at least $1 \times 10^{19}$ atoms/cm$^3$, and by setting the concentration of the impurity elements imparting p-type in the impurity regions 1033a and 1034a as 1.5 to 3 times as much as the concentration of impurity elements imparting n-type.

Thereafter, as shown in FIG. 11C, a first interlayer insulating film 1037 is formed over the second shape conductive layers 1018 to 1021 and the gate insulating film 1006. The first interlayer insulating film 1037 can be formed by a silicon oxide film, a silicon nitride oxide film, a silicon nitride film, or a lamination film comprising these films. In either case, the first interlayer insulating film 1037 is formed by inorganic insulating materials. The first interlayer insulating film 1037 is formed to have a thickness of from 100 to 200 nm. In the case that a silicon oxide film is used as the first interlayer insulating film 1037, the film can be formed by mixing TEOS and O$_2$ by plasma CVD in the conditions, that is, a reaction pressure of 40 Pa; a substrate temperature of from 300 to 400° C.; and an electric discharge at a high frequency (13.56 MHz) power density of from 0.5 to 0.8 W/cm$^2$. Moreover, in the case a silicon nitride oxide film is used as the first interlayer insulating film 1037, a silicon nitride oxide film formed by SiH$_4$, NH$_3$, and N$_2$O, or a silicon nitride oxide film formed by SiH$_4$, and N$_2$Q by plasma CVD can be used. In this instance, the first interlayer insulating film 1037 may be formed in the condition, that is, a reaction pressure of from 20 to 200 Pa; a substrate temperature of from 300 to 400° C.; and a high frequency (60 MHz) power density of from 0.1 to 1.0 W/cm$^2$. Moreover, as the first interlayer insulating film 1037, a silicon nitride oxide hydride film formed by SiH$_4$, N$_2$O, and H$_2$ can be used as well. Similarly, a silicon nitride film can be formed by SiH$_4$, and NH$_3$ by plasma CVD as well.

Then, a process for activating impurity elements imparting n-type or p-type doped in each the concentration is carried out. The process is carried out by thermal annealing using an annealing furnace. Besides, laser annealing or rapid thermal annealing (RTA) can be employed as well. The thermal annealing is carried out in the presence of nitrogen of at most 1 ppm, preferably, at most 0.1 ppm at from 400 to 700° C., typically, from 500 to 600° C. In this embodiment, heat treatment is carried out at 550° C. for 4 hours. Moreover, in the case that a plastic substrate having poor heat-resistance is used for the substrate 1000, laser annealing is preferably used. The laser annealing may be carried out by using linear laser light from an Nd: YAG laser explained in Embodiment Mode 2, or the conventional excimer laser, or the like.

Next, a process for hydrogenating the semiconductor layer by heat treatment is carried out at from 300 to 450° C. for from 1 to 12 hours in the atmosphere gas containing hydrogen of from 3 to 100% which is different from that used for the activation carried out previously. Accordingly, the dangling bond of $10^{16}$ to $10^{18}/cm^3$ in the semiconductor layer is terminated by hydrogen which is thermally excited. As another means for hydrogenation, plasma hydrogenation (using hydrogen excited by plasma) can be carried out. In either case, the defect density in the semiconductor layers 1002 to 1005 is preferably reduced to at most $10^{16}/cm^3$. Therefore, hydrogen of approximately from 0.01 to 0.1 atomic % may be added.

Then, a second interlayer insulating film 1039 is formed by organic insulating materials to have an average thickness of from 1.0 to 2.0 µm. As organic resin materials, polyimide, acrylic, polyamide, polyimide amide, BCB (benzocyclobutene), or the like can be used. For example, in the case that polyimide which is thermal polymerized after coating over a substrate is used, the second interlayer insulating film 1039 is formed by baking at 300° C. in a clean oven. Moreover, in the case that acrylic is used, the second interlayer insulating film 1039 can be formed by acrylic of two liquid type in the following procedure, that is, main agent is mixed into curing agent; the mixed agent is coated over the whole surface of the substrate by a spinner; and the coated film is preliminary heated using a hot plate at 80° C. for 60 seconds and baked at 250° C. for 60 minutes in a clean oven.

Accordingly, the surface of the film can be well planarized by forming the second interlayer insulating film 1039 by organic insulated materials. Moreover, since the organic resin materials have generally low dielectric constant, the parasitic capacity can be reduced. However, the organic resin material is unsuitable for a protection film since it has moisture absorbing properties. Therefore, the organic resin material may be used together with a silicon oxide film, a silicon nitride oxide film, a silicon nitride film, or the like, each of which is formed as the first interlayer insulating film 1037.

Thereafter, a resist mask patterned in a predetermined manner is formed, and contact holes which reach a source region or a drain region are formed in each semiconductor layer. The contact holes are formed by dry etching. In this instance, the second interlayer insulating film 1039 formed by organic resin materials is etched firstly using a mixture gas of $CF_4$, $O_2$, and He as an etching gas. Subsequently, the first interlayer insulating film 1037 is etched using an etching gas of $CF_4$ and $O_2$. Furthermore, in order to increase the selection ratio of the contact holes to the semiconductor layer, contact holes can be formed by etching a third shape gate insulating film 1006 using an etching gas which is replaced with $CHF_3$.

Next, a conductive metal film is deposited by sputtering or vacuum vapor deposition, and patterned by masks, then, etched to form source wirings 1040 to 1043 and drain wirings 1044 to. 1046. Though not shown in the drawings, the wirings are formed by a lamination film comprising a Ti film having a thickness of 50 nm, and an alloy film (an alloy film of Al and Ti) having a thickness of 500 nm in this embodiment.

Figure 12A:
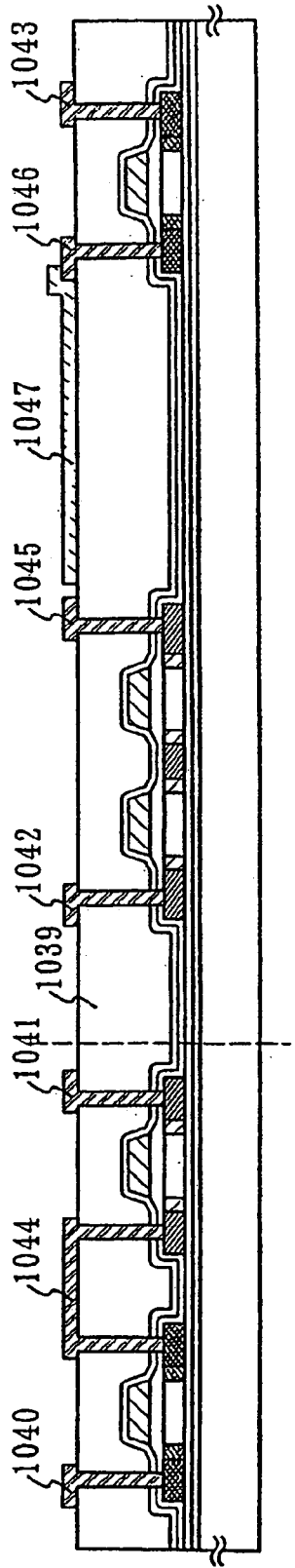
FIGS. 12A and 12B show processes for manufacturing a TFT included in an EL display device.
Figure 13:
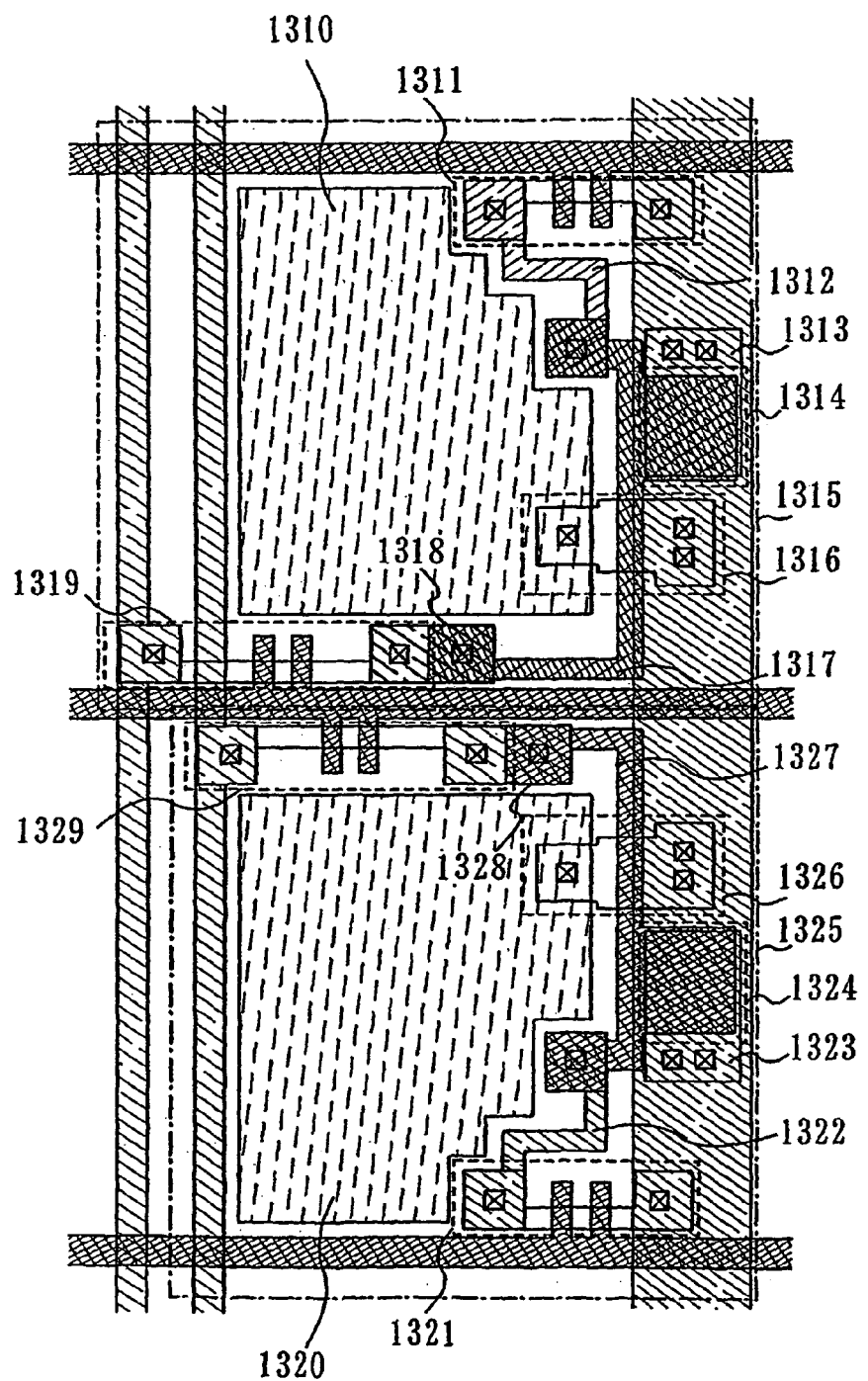
FIG. 13 shows a pixel portion of an EL display device manufactured according to the invention.

Then, a transparent conductive film is formed to have a thickness of from 80 to 120 nm thereon and patterned to a pixel electrode 1047 (FIG. 12A). In this embodiment, an indium-tin oxide (ITO) film or a transparent conductive film formed by indium oxide added with zinc oxide (ZnO) of from 2 to 20% is used as the transparent electrode.

Further, the pixel electrode 1047 can be electrically connected to the drain region of a drive TFT 1063 by forming the pixel electrode 1047 so as to overlap and be in contact with the drain wiring 1046.

Figure 12B:
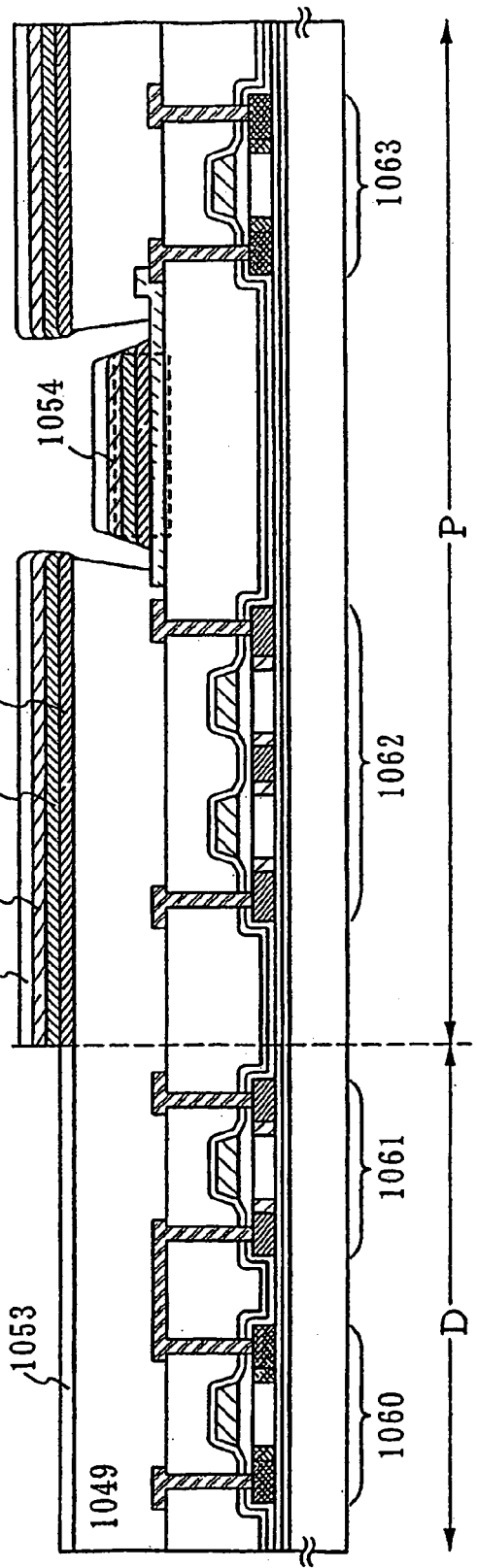

Next, as shown in FIG. 12B, a third interlayer insulating film 1049 having an opening at a position corresponding to the pixel electrode 1047 is formed. The third interlayer insulating film 1049 having insulation properties serves as a bank so as to separate an organic light-emitting layer of adjacent pixels. In this embodiment, the third interlayer insulating film 1049 is formed by resist.

In this embodiment, the third interlayer insulating film 1049 is formed to have a thickness of approximately 1 µm. The opening is formed to have so-called a reverse tapered shape, that is, the opening is broadened toward the pixel electrode 1047. The opening is formed in accordance with the following procedures; resist is deposited, the area except the portion to be openings is covered by masks, the uncovered region is irradiated with UV light to be exposed, and the exposed region is eliminated by developing liquid.

By forming the third insulating film 1049 to have a reverse tapered shape, an organic compound layer can be prevented from cracking or exfoliating due to the fact that the organic light-emitting layer is divided by the adjacent pixels at the time of film formation of the organic light emitting layer, even in the case that the coefficients of thermal expansion of the organic light emitting layer is different from that of the third interlayer insulating film 1049.

Although a resist film is used as the third interlayer insulating film in this embodiment, in some cases, polyimide, polyamide, acrylic, BCB (benzocyclobutene), a silicon oxide film, or the like can be used as well. The third interlayer insulating film 1049 can be either organic or inorganic as long as the third interlayer insulating film 1049 has insulation properties.

Next, an organic compound layer 1050 is formed by vapor deposition, and a cathode (MgAg electrode) 1051 and a protection electrode 1052 are formed by vapor deposition. At the time, moisture in the pixel electrode 1047 is preferably removed by heat treatment completely prior to forming the organic compound layer 1050 and the cathode 1051. Although an MgAg electrode is used as a cathode of a light-emitting element in this embodiment, another known materials can be used as well.

As the organic compound layer 1050, known materials can be used. Although the organic light-emitting layer is formed to have a two-layer structure comprising a hole transporting layer and a light-emitting layer in this embodiment, a hole injecting layer, an electron injecting layer, or an electron transporting layer may also be formed. Accordingly, various examples of the combination have been reported, and any one of them can be used for the organic compound layer.

In this embodiment, polyphenylene vinylene is deposited by vapor deposition as a hole transporting layer. Moreover, as a light-emitting layer, polyvinyl carbazole molecular dispersed with PBD of 1,3,4-oxadiazol derivative of from 30 to 40% is deposited by vapor deposition, and added with coumarin 6 of approximately 1% as a luminescence center of green light emission.

Moreover, the protection electrode 1052 can protect the organic compound layer 1050 from moisture or oxygen, more preferably, a protection film 1053 is provided. In this embodiment, a silicon nitride film is formed to have a thickness of 300 nm as the protection film 1053. The protection film 1053 can be formed immediately after forming the protection electrode 1052 without exposing to the atmosphere.

Moreover, the protection electrode 1052 is provided to prevent the cathode 1051 from being deteriorated. A metal film having aluminum as its main components is typically used as a protective electrode. Of course, another material can be used as well. Moreover, since the organic compound layer 1050 and the cathode 1051 are extremely weak against moisture, the protection electrode 1052 is preferably formed continuously without exposing to the atmosphere for protecting the organic light emitting layer from the outside air.

The organic compound layer 1050 may be formed to have a thickness of from 10 to 400 nm (typically, from 60 to 150 nm), and the cathode 1051 may be formed to have a thickness of from 80 to 200 nm (typically, from 100 to 150 nm).

Accordingly, a light-emitting device having the structure shown in FIG. 12B is completed. The portion 1054 where the pixel electrode 1047, the organic compound layer 1050, and the cathode 1051 are overlapped each other serves as a light-emitting element.

The p-channel type TFT 1060 and the n-channel type TFT 1061 are a TFT of a driving circuit D composing a CMOS. A switching TFT 1062 and a driver TFT 1063 are a TFT of a pixel portion P. The TFT of the driver circuit D and the TFT of the pixel portion P can be formed over one substrate.

Further, in case of a light-emitting device using a light-emitting element, the deterioration of a TFT due to hot electron becomes not a problem since the voltage of a power source of approximately from 5 to 6 V, 10V at a maximum is enough for the driving circuit. Moreover, since it is necessary to operate the driving circuit at high speed, the gate capacity of a TFT is preferably small. Therefore, in the driver circuit of a light-emitting device using a light-emitting element according to the invention, a second impurity region 1029 and a fourth impurity region 1033b, each of which is included in the semiconductor layer of the TFT, are preferably not overlapped with the gate electrodes 1018 and 1019, respectively.

A method for manufacturing a light-emitting device according to present invention is not limited to that explained in this embodiment. A light-emitting device according to the invention can be manufactured by a known method.

Further, though only a method for manufacturing a light-emitting device is explained in this embodiment, a liquid crystal display device having a thin film transistor can be applied with the same laser crystallization.

EMBODIMENT 2

An embodiment according to the present invention will be explained with reference to FIGS. 5A and 5B. A process for forming a crystalline semiconductor film by laser irradiation will be explained in this embodiment. A thin film transistor can be formed after forming the crystalline semiconductor film by the process described in Embodiment 1 or a known process.

In FIG. 10A, glass such as barium borosilicate glass or aluminoborosilicate glass as represented by the glass #7059 or the glass #1737 of Corning Co. can be used as a substrate 1000. Besides, a plastic substrate such as a quartz substrate, polyethylene terephthalate (PET), polyethylene naphthalate (PEN), or polyether sulfone (PES) can be used.

In order to prevent impurities from diffusing from the substrate 1000, a base film 1001 is formed by an insulating film such as silicon oxide film, silicon nitride film, or silicon oxynitride film over the surface of the substrate 1000 provided with TFTs. In this embodiment, the base film 1001 has a two-layer structure, but the base film may be formed by a single layer of the insulating film or two or more laminated layers of the insulating films. The first layer of the base film 1001 is formed by a silicon oxynitride film 1001a which is formed to have a thickness of from 10 to 200 nm (preferably, from 50 to 100 nm) by plasma CVD using $SiH_4$, $NH_3$ and $N_2O$ as a reaction gas. In this embodiment, the silicon oxynitride film 1001a (having a composition ratio of Si=32%, O=27%, N=24%, H=17%) is formed to have a thickness of 50 nm. The second layer of the base film 1001 is formed by a silicon oxynitride film 1001b which is formed to have a thickness of from 50 to 200 nm (preferably, from 100 to 150 nm) by plasma CVD using $SiH_4$ and $N_2O$ as a reaction gas. In this embodiment, the silicon oxynitride film 1001b (having a composition ratio of Si=32%, O=59%, N=7%, H=2%) is formed to have a thickness of 100 nm.

An amorphous semiconductor film 1003 is formed to have a thickness of from 25 to 150 nm (preferably, 30 to 60 nm) by a known means such as plasma CVD, LPCVD, or sputtering. Though there is no limitation on the material of the semiconductor film, silicon or a silicon-germanium ($Si_xGe_{1-x}$ (X=0.0001 to 0.02)) alloy is preferably used. In this embodiment, the amorphous silicon film is formed to have a thickness of 55 nm by plasma CVD.

Here, a substrate provided with a crystalline semiconductor film is set to the optical system shown in FIGS. 5A and 5B, and the crystalline semiconductor film is recrystallized by CW laser light irradiation. The substrate is secured by the substrate holder filled with water shown in FIGS. 2A and 2B. The CW laser has output power of 8 W, beam diameter of 500 μm×20 μm, and scanning rate of 50 cm/s. The beam damper of the substrate holder shown in FIGS. 2A and 2B is adjusted to a scanning pitch.

This embodiment explains that an amorphous silicon film is directly irradiated with laser light. Further, the laser absorption of the amorphous silicon film at 532 nm is larger than that of the crystalline silicon film. Therefore, the energy density of laser can be reduced compared with the crystallization explained in Embodiment 1. Here, beam diameter along major axis can be extended. Accordingly, the number of scanning and the time for processing per one substrate can be reduced.

EMBODIMENT 3

In this embodiment, an example of crystallizing a semiconductor film using an optical system according to the present invention will be explained with reference to FIGS. 5A, 5B, 14, and 15.

A base film formed over a glass substrate by an insulating film such as silicon oxide film, silicon nitride film, or silicon oxynitride film. The first layer of the base film is formed by a silicon oxynitride film (having a composition ratio of Si=32%, O=27%, N=24%, H=17%) which is formed to have a thickness of 50 n by plasma CVD using $SiH_4$, $NH_3$ and $N_2O$ as a reaction gas. The second layer of the base film is formed by a silicon oxynitride film (having a composition ratio of Si=32%, O=59%, N=7%, H=2%) which is formed to have a thickness of 100 nm by plasma CVD using $SiH_4$ and $N_2O$ as a reaction gas. Then, an amorphous silicon film is formed over the base film as a semiconductor film to have a thickness of 50 nm by plasma CVD. Hydrogen contained in the amorphous silicon is released by heat treatment at 500° C. for 1 hour in the presence of nitrogen. This is because that the amorphous silicon film containing a large amount of hydrogen is broken by laser light irradiation.

Here, a substrate provided with a crystalline semiconductor film is set to the optical system shown in FIGS. 5A and 5B to recrystallize the crystalline semiconductor film by CW laser light irradiation. The substrate is secured by the substrate holder filled with water shown in FIGS. 2A and 2B. The CW laser has output power of 10 W, beam diameter of 400 µm×25 µm, and scanning rate of 58 cm/s.

Figure 14:
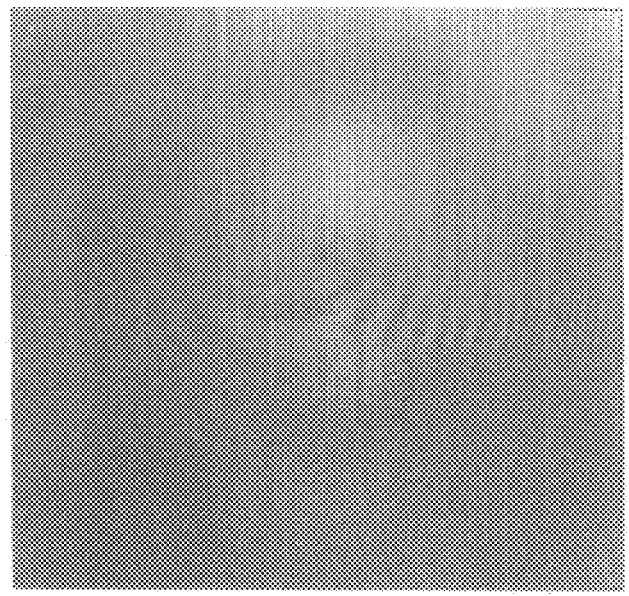
FIG. 14 is a photograph showing the surface of a semiconductor film crystallized by the conventional method.
Figure 15:
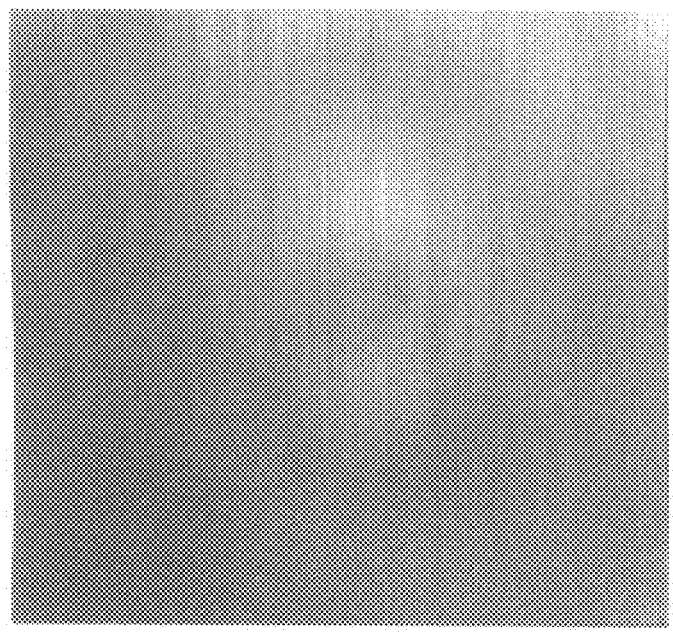
FIG. 15 is a photograph showing the surface of a semiconductor film crystallized according to the invention.

FIG. 15 shows the results of observing the surface of the obtained crystalline semiconductor film. FIG. 14 shows the result of observing the surface of the crystalline semiconductor film which is crystallized by the conventional laser irradiation without practicing the present invention. The substrates shown in FIGS. 14 and 15 have the size of 5×5 inches.

As shown in FIG. 14, a crystalline semiconductor film which is crystallized by the conventional laser crystallization has interference fringes in a cross direction. However, the crystalline semiconductor film which is crystallized by the laser crystallization according to the invention has no strong interference fringes in a cross direction as observed in the center portion shown in the photograph in FIG. 14. Hence, laser annealing can be carried out uniformly without interference fringes according to the invention.

According to the invention, interference of reflective light from the reverse side of a substrate and the surface of the semiconductor film generated during laser annealing of a semiconductor film formed over the substrate that is transparent to laser beam can be prevented. Accordingly, further uniform laser annealing of a semiconductor film can be carried out. The present invention has less impact on the global environment since harmless water is used at low cost. Mixture can be dissolved in the water. For example, the refractive index is increased to 1.37 by dissolving simple sugar of 24% in a concentration in the water.

The liquid proposed in Embodiment Mode have the refractive index within the range of from 1.5±0.05 which is close to that of glass. Liquid which has optimum refractive index may be selected depending on the kind of a substrate.

Here, crystallization is explained; however, the laser annealing can be employed for the activation of source and drain regions. With respect to kinds of laser, it is not limited to CW (continuous wave) laser, but pulse oscillation type Nd: YAG laser, YLF laser, or the like, which has long coherent length can be used since it has problems similarly to the CW laser.

The invention claimed is:

1. A laser beam treatment device comprising:
an oscillation source;
an optical system for changing an incident angle of a laser light to a semiconductor film; and
a substrate holder for securing the substrate, which is directly in contact with liquid and is transparent to the laser light, over the substrate holder, the substrate holder having a depressed portion,
wherein the substrate holder is configured to hold the liquid in the depressed portion; and
wherein a bottom surface of the substrate holder has a beam damper.

2. A laser beam treatment device according to claim 1, wherein refractive indexes as a function of wavelength of the laser light of the substrate and the liquid are the same as each other.

3. A laser beam treatment device according to claim 1, wherein let $N_0(\lambda)$ be a refractive index of the substrate and let $N_1(\lambda)$ be a refractive index of the liquid as a function of wavelength of the laser light, respectively, a reflectance R of a reverse side of the substrate satisfies an inequality:

$$0 \leq R \leq 0.03.$$

4. A laser beam treatment device according to claim 1, wherein let $N_0(\lambda)$ be a refractive index of the substrate and let $N_1(\lambda)$ be a refractive index of the liquid as a function of wavelength of the laser light, respectively, a reflectance R of a reverse side of the substrate satisfies an inequality:

$$0 \leq R \leq 0.005.$$

5. A laser beam treatment device according to claim 1, wherein the liquid is at least one selected from the group consisting of water, acetylacetone, acetophenone, anisole, aniline, ethylbenzene, ethyldiamine, benzenecarbonyl chloride, glycerin, o-xylene, m-xylene, p-xylene, chlorobenzene, tetrachloroethylene, toluene, nicotine, silicon disulfide, (+)-α-pinene, pyridine, pyrrole, phenol, carbon tetrachloride, cyclohexanol, cyclohexanone, cyclohexene, 1,2-dichloroethane, dibromomethane, thiophene, cis-decalin, trans-decalin, bromobenzene, benzylamine, benzaldehyde, benzene, benzonitrile, formamide, mesitylene, 2-methylpyridine, methyl iodide, and iodine iodide.

6. A laser beam treatment device according to claim 1, wherein the oscillation source is at least one selected from the group consisting of an excimer laser, a $YVO_4$ laser, a YAG laser, YLF laser, a glass laser, a $Y_2O_3$ laser, a $YAlO_3$ laser, a ruby laser, an alexandrite laser, a Ti: sapphire laser, an Ar laser, a Kr laser, a $CO_2$ laser, a helium-cadmium laser, a copper vapor laser, and a gold vapor laser.

7. A laser beam treatment device according to claim 1, wherein the semiconductor film is an amorphous semiconductor film.

8. A laser beam treatment device according to claim 1, wherein the semiconductor film is a crystalline semiconductor film.

9. A laser beam treatment device according to claim 7, wherein the laser beam treatment device is used for laser crystallization.

10. A laser beam treatment device according to claim 8, wherein the laser beam treatment device is used for laser crystallization.

11. A laser beam treatment device according to claim 1, wherein the optical system comprises at least one galvanometer mirror for changing the incident angle of the laser light.

12. A laser beam treatment device according to claim 1, wherein the optical system comprises at least one polygon mirror for changing the incident angle of the laser light.

13. A laser beam treatment device according to claim 1, wherein the substrate is not moved while irradiating the laser light to the semiconductor film.

14. A laser beam treatment device according to claim 1, wherein the laser light is a CW laser light.

15. A laser beam treatment device according to claim 14, wherein the CW laser light has an output power of 8 W, a beam diameter of 500 µm×20 µm, and a scanning rate of 50 cm/s.

16. A laser beam treatment device according to claim 14, wherein the CW laser light has an output power of 10 W, a beam diameter of 400 µm×25 µm, and a scanning rate of 58 cm/s.

17. A laser beam treatment device according to claim 1, wherein a bottom surface of the substrate holder is formed to be rough so as to exhibit a diffuse reflection.

18. A laser beam treatment device according to claim 1, wherein the optical system has a function for changing a shape of the laser light emitted from the oscillation source into a linear or an elliptical shape on the semiconductor film.

* * * * *